United States Patent
Lim

(10) Patent No.: US 7,714,380 B2
(45) Date of Patent: May 11, 2010

(54) SEMICONDUCTOR DEVICE AND METHOD OF MANUFACTURING THE SEMICONDUCTOR DEVICE

(75) Inventor: Tae-Hong Lim, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 232 days.

(21) Appl. No.: 11/984,012

(22) Filed: Nov. 13, 2007

(65) Prior Publication Data

US 2008/0067582 A1 Mar. 20, 2008

Related U.S. Application Data

(62) Division of application No. 11/313,852, filed on Dec. 22, 2005, now Pat. No. 7,319,060.

(30) Foreign Application Priority Data

Dec. 22, 2004 (KR) ............... 10-2004-0110625

(51) Int. Cl.
 *H01L 29/78* (2006.01)
(52) U.S. Cl. ............... 257/324; 257/E21.442; 257/E21.621; 257/E21.625; 257/E21.629; 257/E29.255; 257/343; 257/385; 257/406; 257/E29.267; 257/E29.122
(58) Field of Classification Search ......... 257/324, 257/E21.442, E21.621, E21.625, E21.629, 257/E29.255, 67, E21.41, E21.693, 343, 257/385, 406, E29.267, E29.122, E29.177; 438/300
See application file for complete search history.

(56) References Cited

U.S. PATENT DOCUMENTS

| | | | | |
|---|---|---|---|---|
| 6,284,610 B1 * | 9/2001 | Cha et al. | ............... | 438/300 |
| 6,756,277 B1 * | 6/2004 | Yu | ............... | 438/300 |
| 7,119,435 B2 * | 10/2006 | Lee | ............... | 257/714 |

OTHER PUBLICATIONS

Office Action dated Mar. 21, 2007 from the parent application.
Notice of Allowance dated Aug. 14, 2007 from the parent application.

* cited by examiner

*Primary Examiner*—Matthew E Warren
*Assistant Examiner*—David Spalla
(74) *Attorney, Agent, or Firm*—Lowe Hauptman Ham & Berner LLP

(57) ABSTRACT

A semiconductor device includes a pair of first source/drain regions disposed on a silicon substrate. A first silicon epitaxial layer pattern defines a gate forming region that exposes the silicon substrate between the pair of first source/drain regions. A first gate insulation layer is disposed on the silicon substrate in the gate forming region. A second gate insulation layer is disposed on a sidewall of the first silicon epitaxial layer pattern. A second silicon epitaxial layer pattern is disposed in the gate forming region and on the first silicon epitaxial layer pattern. A pair of second source/drain regions is disposed on the second silicon epitaxial layer pattern. A third gate insulation layer exposes the second silicon epitaxial layer pattern in the gate forming region and covers the pair of second source/drain regions. A gate is disposed on the second silicon epitaxial layer pattern in the gate forming region.

8 Claims, 4 Drawing Sheets

SEMICONDUCTOR DEVICE AND METHOD OF MANUFACTURING THE SEMICONDUCTOR DEVICE

CROSS REFERENCE TO RELATED APPLICATION

This application is a divisional of U.S. Ser. No. 11/313,852, filed on Dec. 22, 2005. now U.S. Pat. No. 7,319,060 This application, in its entirety, is incorporated herein by reference.

BACKGROUND OF THE INVENTION (a) Field of the Invention

The present invention relates to a semiconductor device and a method of manufacturing the semiconductor device, and more particularly to the method of manufacturing the semiconductor device including a gate.

(b) Discussion of the Related Art

Generally a known semiconductor device (for example, a MOS transistor) includes source/drain regions formed in a silicon substrate. A gate insulation layer is formed on the silicon substrate between the source/drain regions, and a gate is formed on the gate insulation layer. When an electric field is applied to the gate, carriers move through channels formed in the silicon substrate under the gate insulation layer, such that the semiconductor device can be turned on and off.

In the known semiconductor device having a single gate and a single gate insulation layer, the semiconductor device is driven by a single voltage. Integration of such a semiconductor device is limited, however, because the semiconductor is driven by a single voltage.

SUMMARY OF THE INVENTION

To address the above-described and other problems, it is an object of the present invention to provide a semiconductor device that includes a pair of first source/drain regions disposed on a silicon substrate. A first silicon epitaxial layer pattern defines a gate forming region that exposes the silicon substrate between the pair of first source/drain regions. A first gate insulation layer is disposed on the silicon substrate in the gate forming region. A second gate insulation layer is disposed on a sidewall of the first silicon epitaxial layer pattern. A second silicon epitaxial layer pattern is disposed in the gate forming region and on the first silicon epitaxial layer pattern. A pair of second source/drain regions is disposed on the second silicon epitaxial layer pattern. A third gate insulation layer exposes the second silicon epitaxial layer pattern in the gate forming region and covers the pair of second source/drain regions. A gate is disposed on the second silicon epitaxial layer pattern in the gate forming region.

The present invention further provides a method of manufacturing a semiconductor device, including forming a pair of first source/drain regions on a silicon substrate, forming an insulation layer pattern and a first silicon epitaxial layer pattern defining a gate forming region to expose the silicon substrate between the pair of first source/drain regions, and forming a first gate insulation layer on the silicon substrate in the gate forming region. A second gate insulation layer is formed on a sidewall of the first silicon epitaxial layer pattern, and a second silicon epitaxial layer pattern is formed in the gate forming region and on the first silicon epitaxial layer pattern. Impurities are implanted into a periphery of the second silicon epitaxial layer in the gate forming region to form a pair of second source/drain regions. The second silicon epitaxial layer is partially etched in the gate forming region to form a second silicon epitaxial layer pattern. A third gate insulation layer is formed that exposes a surface of the second silicon epitaxial layer pattern in the gate forming region and that covers lateral sides of the pair of second source/drain regions, and a gate is formed on an exposed surface of the second silicon epitaxial layer pattern.

BRIEF DESCRIPTION OF THE DRAWINGS

The accompanying drawings, which are incorporated in and constitute a part of the specification, illustrate an embodiment of the invention, and together with the description serve to explain principles of the invention.

DETAILED DESCRIPTION OF THE INVENTION

Figure 1:
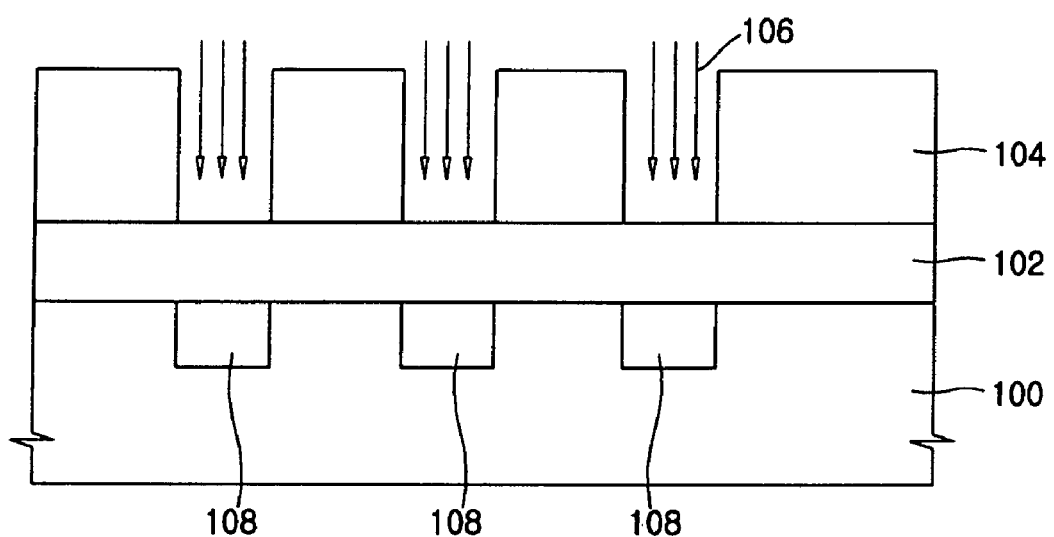
FIGS. 1-7 are cross-sectional views showing sequential stages of a method of manufacturing a semiconductor device according to the present invention.

An exemplary embodiment of the present invention is described below with reference to the accompanying drawings.

Thicknesses of the regions and layers shown in the drawings are enlarged to better show features of the invention.

Figure 7:
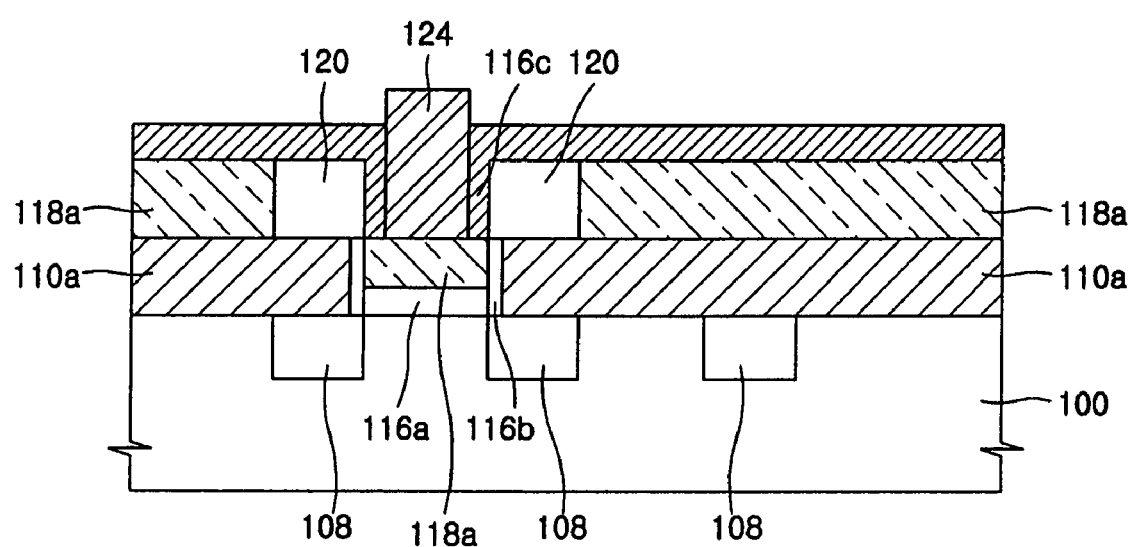

FIG. 7 shows an example of a semiconductor device according to the present invention.

As shown in FIG. 7, a pair of first source/drain regions 108 is formed in a silicon substrate 100. A first silicon epitaxial layer pattern 110a is formed on the silicon substrate. The first silicon epitaxial layer pattern 110a includes a gate forming region 114 (e.g., a hole exposing the silicon substrate 100) between the pair of first source/drain regions 108. The gate forming region 114 extends above the pair of first source/drain regions 108.

A first gate insulation layer 116a is formed on the silicon substrate 100 in the gate forming region 114, and a second gate insulation layer 116b is formed on each sidewall of the first silicon epitaxial layer pattern 110a. One or both of the first gate insulation layer 116a and the second gate insulation layer 116b can be formed of an oxide. A second silicon epitaxial layer pattern 118a is formed in the hole-shaped gate forming region 114 and on the first silicon epitaxial layer pattern 110a. The hole-shaped gate forming region 114 in the first silicon epitaxial layer pattern 110a is filled with a second silicon epitaxial layer pattern 118a.

A pair of second source/drain regions 120 is formed in the second silicon epitaxial layer pattern 118a, at locations above the pair of first source/drain regions 108. A third gate insulation layer 116c is formed in the gate forming region 114 and on the second epitaxial layer pattern 118a. The second silicon epitaxial layer pattern 118a in the hole-shaped gate forming region 114 is exposed through the third gate insulation layer 116c, and the pair of second source/drain regions 120 is covered by the third gate insulation layer 116c.

A gate 124 is formed on the second silicon epitaxial layer pattern 118a in the gate forming region 114. The second and third gate insulation layers 116b and 116c are formed on lateral sides of the gate 124.

The semiconductor device according to the present invention can be driven to be turned on and off by using the first, second and third gate insulation layers 116a, 116b and 116c formed between the pair of first source/drain regions 108, between the pair of second source/drain regions 120, and between the first and second source/drain regions 108 and 120. When the first, second and third gate insulation layers 116a, 116b and 116c are formed having different thicknesses, the semiconductor device can be driven by several different voltages, although the device includes only one gate. Thus, the semiconductor device in accordance with the present invention is highly integrated.

A method of manufacturing the semiconductor device is now described with reference to FIGS. 1-7.

FIG. 1 shows a buffer oxide layer 102 formed on the silicon substrate 100. A mask pattern 104 is formed to partially expose the buffer oxide layer 102. The first source/drain regions 108 are formed by ion implantation of source/drain impurities 106 into the silicon substrate 100, by using the mask pattern 104 as an ion implantation mask. When the silicon substrate 100 is a p-type silicon substrate, an n-type impurity (e.g., arsenic (AR) or phosphorus (P)) can be used as the source/drain impurity. Alternately, when the silicon substrate 100 is an n-type silicon substrate, a p-type impurity (e.g., boron (B)) can be used as the source/drain impurity.

Figure 2:
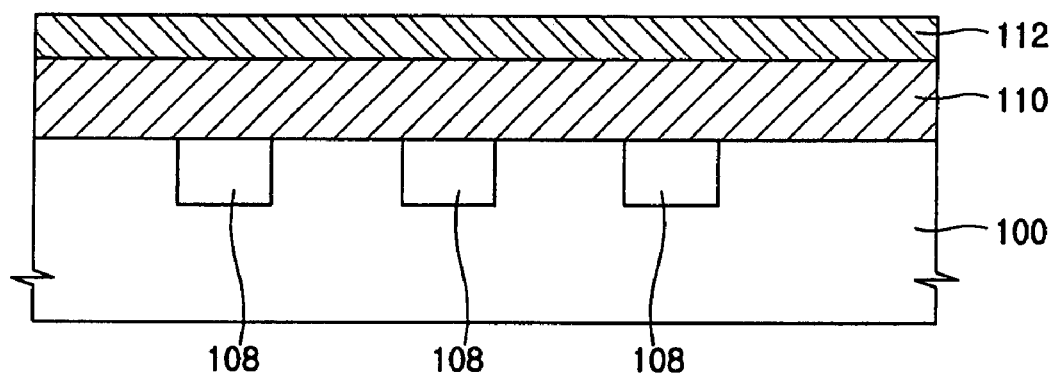

After removing the mask pattern 104 and the buffer oxide layer 102, the first silicon epitaxial layer 110 and the first insulation layer 112 are formed, as shown in FIG. 2. The first insulation layer 112 can be formed of silicon nitride.

Figure 3:
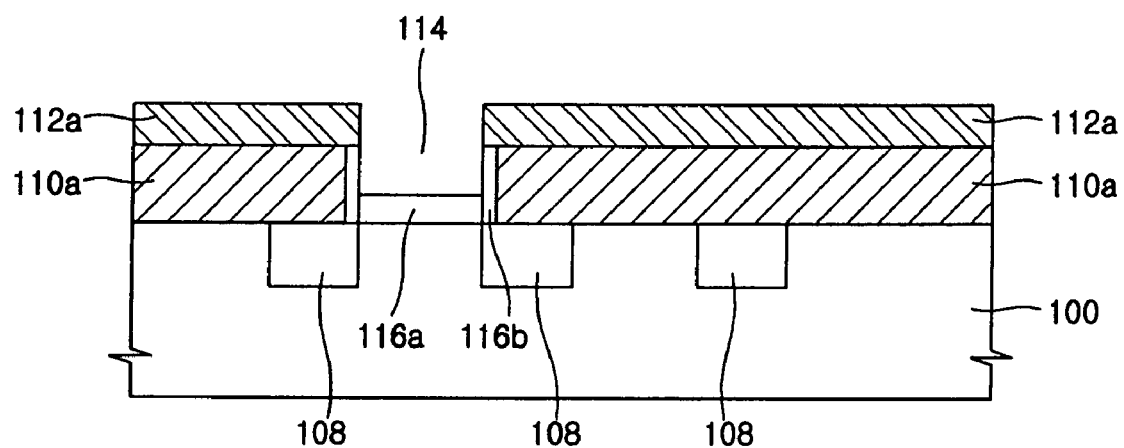

FIG. 3 shows that the first insulation layer 112 and the first silicon epitaxial layer 110 are patterned such that the gate forming region 114 is formed to expose the silicon substrate 100 between the pair of first source/drain regions 108. The first insulation layer pattern 112a and the first silicon epitaxial layer pattern 110a are formed by the patterning of the first insulation layer 112 and the first silicon epitaxial layer 110.

The first gate insulation layer 116a is formed by oxidation of a surface of the silicon substrate 100 in the gate forming region 114. The second gate insulation layer 116b is formed by oxidation of sidewalls of the first silicon epitaxial layer pattern 110a. One or both of the first and second gate insulation layers 116a and 116b can be formed of an oxide.

Figure 4:
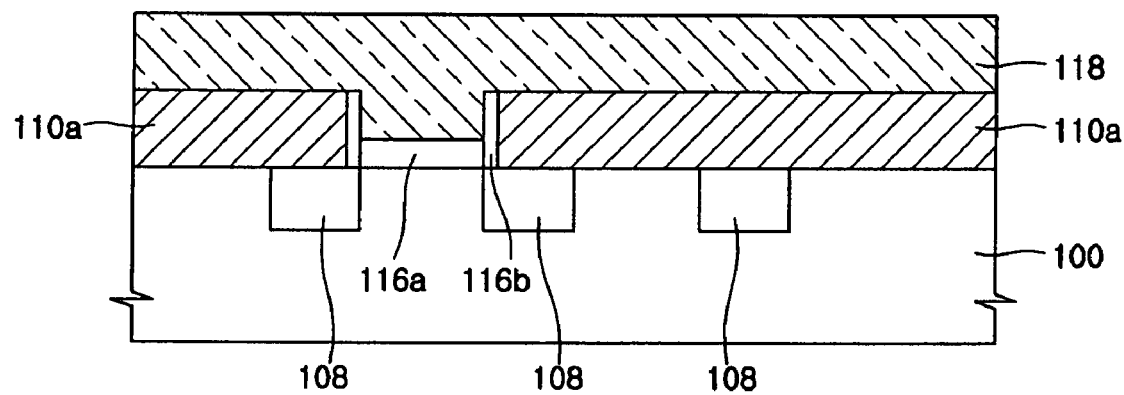

After removal of the first insulation layer pattern 112a, a second silicon epitaxial layer 118 is formed on the first and second gate insulation layers 116a and 116b in the gate forming region 114 and on the first silicon epitaxial layer pattern 110a, as shown in FIG. 4. The hole-shaped gate forming region 114 is filled with the second silicon epitaxial layer 118.

Figure 5:
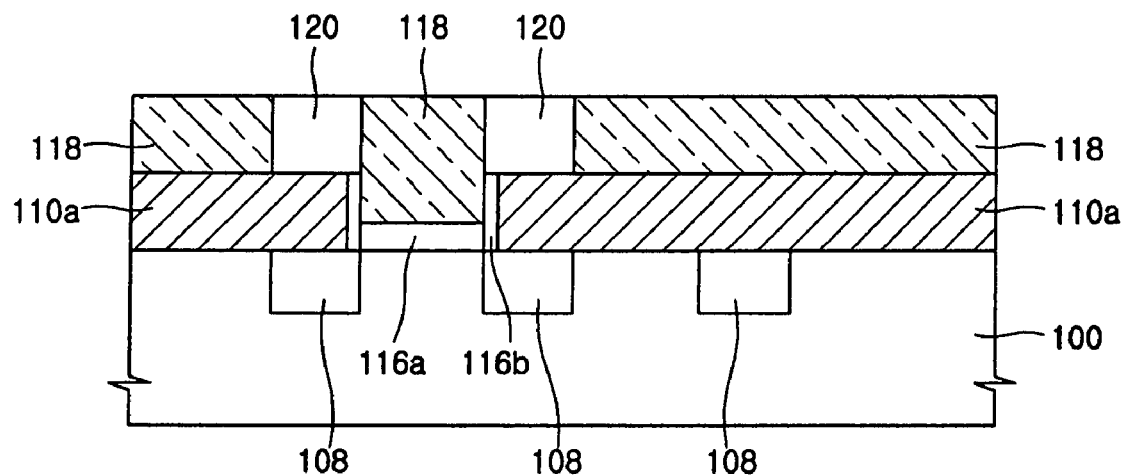

As shown in FIG. 5, the pair of second source/drain regions 120 is formed by ion implantation of impurities into a periphery of the second silicon epitaxial layer 118 that fills the hole-shaped gate forming region 114. The pair of second source/drain regions 120 is formed above the pair of first source/drain regions 108.

Figure 6:
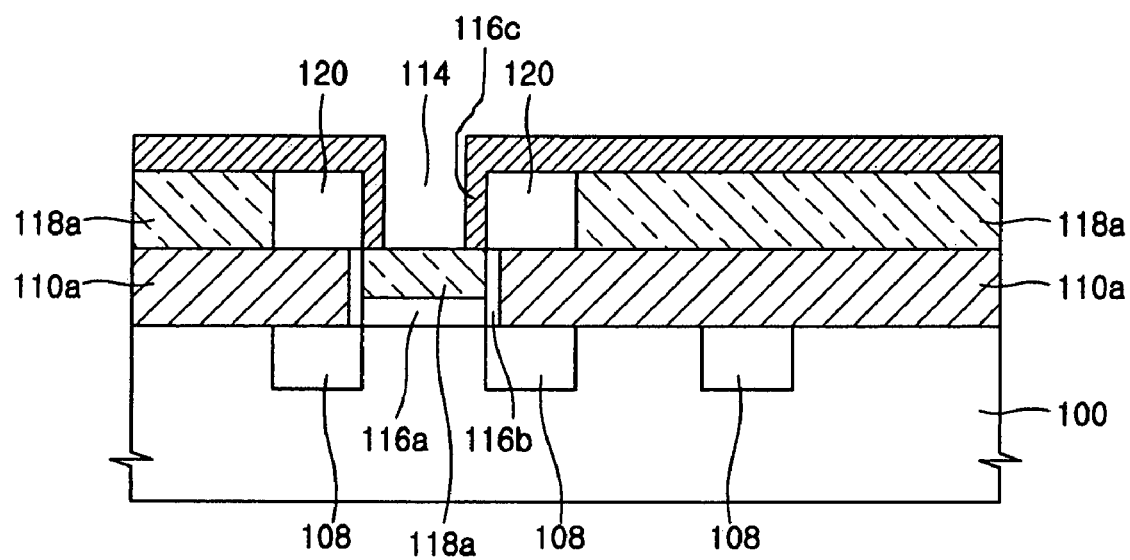

FIG. 6 shows that the second silicon epitaxial layer 118 formed in the gate forming region 114 is partially etched so as to have a predetermined thickness. As shown in the figures, the second silicon epitaxial layer pattern 118a is formed on the first gate insulation layer 116a and on the first silicon epitaxial layer pattern 110a.

A second insulation layer (not shown) is formed on the second silicon epitaxial layer pattern 118a and on the pair of second source/drain regions 120. The hole-shaped gate forming region 114 is filled with the second insulation layer. The second insulation layer can be formed of tetraethyl orthosilicate (TEOS).

The second insulation layer is patterned to form the third gate insulation layer 116c. As described above, the third gate insulation layer 116c exposes the second silicon epitaxial layer pattern 118a in the hole-shaped gate forming region 114 and covers the pair of second source/drain regions 120.

As shown in FIG. 7, the gate 124 is formed on an exposed surface of the second silicon epitaxial layer pattern 118a in the gate forming region 114. The gate 124 is formed of silicide. The gate 124 is insulated from the pair of second source/drain regions 120 by the third gate insulation layer 116c formed from the second insulation layer pattern.

The highly integrated semiconductor device formed by the above discussed method includes a gate having a plurality of gate insulation layers with different thicknesses.

The above discussion is directed to a preferred embodiment of the invention. It is to be understood, however, that the invention is not limited to the disclosed embodiment. Rather, the invention is intended to cover various modifications and equivalent arrangements included within the spirit and scope of the appended claims.

The present application claims priority to, and incorporates by reference herein in its entirety, Korean patent application no. 10-2004-0110625, filed on Dec. 22, 2004.

The invention claimed is:

1. A semiconductor device, comprising:
   a pair of first source/drain regions disposed on a silicon substrate;
   a first silicon epitaxial layer pattern defining a gate forming region that exposes the silicon substrate between the pair of first source/drain regions;
   a first gate insulation layer disposed on the silicon substrate in the gate forming region; a second gate insulation layer disposed on a sidewall of the first silicon epitaxial layer pattern;
   a second silicon epitaxial layer pattern disposed in the gate forming region and on the first silicon epitaxial layer pattern;
   a pair of second source/drain regions disposed on the second silicon epitaxial layer pattern;
   a third gate insulation layer exposing the second silicon epitaxial layer pattern in the gate forming region and covering the pair of second source/drain regions; and
   a gate disposed on the second silicon epitaxial layer pattern in the gate forming region.

2. The semiconductor device according to claim 1, wherein at least two of the first, second and third gate insulation layers have different thicknesses.

3. The semiconductor device according to claim 1, wherein the second gate insulation layer and the third gate insulation layer are formed on lateral sides of the gate.

4. A semiconductor device, comprising:
   a pair of first source/drain regions disposed on a substrate;
   a first epitaxial layer pattern defining a gate forming region that exposes the substrate between the pair of first source/drain regions;
   a first gate insulation layer disposed on the substrate in the gate forming region;
   a second gate insulation layer disposed on a sidewall of the first epitaxial layer pattern;
   a second epitaxial layer pattern disposed in the gate forming region and on the first epitaxial layer pattern;
   a pair of second source/drain regions disposed on the second epitaxial layer pattern;
   a third gate insulation layer exposing the second epitaxial layer pattern in the gate forming region and covering the pair of second source/drain regions; and
   a gate disposed on the second epitaxial layer pattern in the gate forming region.

5. The semiconductor device according to claim 4, wherein at least two of the first, second and third gate insulation layers have different thicknesses.

6. The semiconductor device according to claim 4, wherein the second gate insulation layer and the third gate insulation layer are formed on lateral sides of the gate.

7. The semiconductor device according to claim 6, wherein at least two of the first, second and third gate insulation layers have different thicknesses.

8. The semiconductor device according to claim 4, wherein each of the first, second and third gate insulation layers has a different thickness.

* * * * *